(12) United States Patent
Chen et al.

(10) Patent No.: US 9,680,459 B2
(45) Date of Patent: Jun. 13, 2017

(54) EDGE-AWARE SYNCHRONIZATION OF A DATA SIGNAL

(71) Applicant: Intel Corporation, Santa Clara, CA (US)

(72) Inventors: Gregory K. Chen, Portland, OR (US); Mark A. Anders, Hillsboro, OR (US); Himanshu Kaul, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 14/567,987

(22) Filed: Dec. 11, 2014

(65) Prior Publication Data

US 2016/0173074 A1    Jun. 16, 2016

(51) Int. Cl.
| | | |
|---|---|---|
| *H03L 7/00* | (2006.01) | |
| *H03K 5/135* | (2006.01) | |
| *G11C 8/18* | (2006.01) | |
| *G11C 19/28* | (2006.01) | |
| *G06F 5/10* | (2006.01) | |
| *H03K 5/00* | (2006.01) | |

(52) U.S. Cl.
CPC ............ *H03K 5/135* (2013.01); *G06F 5/10* (2013.01); *G11C 8/18* (2013.01); *G11C 19/287* (2013.01); *H03K 2005/00013* (2013.01)

(58) Field of Classification Search
CPC ............ H03L 7/00; H03L 7/18; H03L 7/193
USPC ......................................... 327/141, 199–203
See application file for complete search history.

(56) References Cited

U.S. PATENT DOCUMENTS

| | | | |
|---|---|---|---|
| 5,396,522 A | 3/1995 | Laflin | |
| 7,180,332 B2 | 2/2007 | Gregorio | |
| 7,310,396 B1 | 12/2007 | Sabih | |
| 7,742,551 B2 * | 6/2010 | Pyeon | H03K 21/38 |
| | | | 375/354 |
| 8,284,766 B2 | 10/2012 | Anders et al. | |
| 2001/0042219 A1 | 11/2001 | Robertson | |
| 2008/0072094 A1 | 3/2008 | Hayano et al. | |
| 2015/0071282 A1 | 3/2015 | Anders et al. | |
| 2015/0188829 A1 | 7/2015 | Satpathy et al. | |

FOREIGN PATENT DOCUMENTS

| | | |
|---|---|---|
| WO | WO 2014/209391 | 12/2014 |
| WO | 2016094012 A1 | 6/2016 |

OTHER PUBLICATIONS

Anders, et al., "A 2.9Tb/s 8W 64-Core Circuit-Switched Network-on-Chip in 45 nm CMOS," IEEE, 2008, 978-1-4244-2362-0/08 (pp. 182-185).

(Continued)

*Primary Examiner* — Lincoln Donovan
*Assistant Examiner* — Diana J Cheng
(74) *Attorney, Agent, or Firm* — Patent Capital Group (57) ABSTRACT

A signal comprising a first edge and a second edge is received. The first edge of the signal is synchronized with a first clock and the synchronized first edge of the signal is passed to an output. The synchronization results in a delay of the first edge of the signal. The second edge of the signal is passed to the output. The passed second edge of the signal has a delay that is less than the delay of the first edge of the signal by at least one clock cycle of the first clock.

20 Claims, 7 Drawing Sheets

(56) References Cited

OTHER PUBLICATIONS

Anders et al., "A 4.1Tb/s Bisection-Bandwidth 560Gb/s/W Streaming Circuit-Switched 8×8 Mesh Network-on-Chip in 45nm CMOS," ISSCC 2010, Session 5, Processors, 5.8, Intel Corporation, IEEE International Solid-State Circuits Conference, Feb. 8, 2010, IEEE Digest of Papers, 978-1-4244-6034-2, (pp. 110-112).
Chen et al., "A 340mV-to-0.9V 20.2Tb/s Source-Synchronous Hybrid Packet/Circuit-Switched 16×16 Network-on-chip in 22nm Tri-Gate, CMOS," ISSCC 2014, Session 16/SoC Building Blocks 16.1, Intel Corporation, 2014 IEEE International Solid-State Circuits Conference, Feb. 11, 2014, IEEE Digest of Technical Papers, 978-1-4244-6034-2 (pp. 276-278).
PCT International Search Report and Written Opinion in International Application No. PCT/US2015/060058 mailed on Apr. 22, 2016; 11 pages.

* cited by examiner

EDGE-AWARE SYNCHRONIZATION OF A DATA SIGNAL

FIELD

The present disclosure relates in general to the field of computer development, and more specifically, to edge-aware synchronization of a data signal.

BACKGROUND

Modern computer systems or networks may include components operating at various speeds. Despite operating at different speeds, two components may be in communication with each other. As an example, a multi-core processor or System-on-Chip (SoC) may include multiple cores that operate according to their own input clocks. A Network-on-Chip (NoC) may relay data between cores and other processing elements using a series of router switches and wiring resources. Since NoCs connect spatially dispersed sections of multi-core processors or SoCs, they may physically span either an entire chip or a large portion of a chip. In multi-core processors or SoCs with varying workloads, heterogeneous processing elements, unbalanced traffic, or fine-grained power management, different regions of a chip may be operated at different voltages and clock frequencies, thus complicating inter-core communication. To facilitate communication between different clock domains, a signal that is asynchronous with a clock domain to which it is communicated may be synchronized with that clock domain in order to avoid problems associated with metastability.

BRIEF DESCRIPTION OF THE DRAWINGS

Like reference numbers and designations in the various drawings indicate like elements.

DETAILED DESCRIPTION

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present disclosure.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™, but may also be used in other devices, such as server computer systems, handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatuses, methods, and systems described herein are not limited to physical computing devices, but may also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the disclosure described herein.

Figure 1:
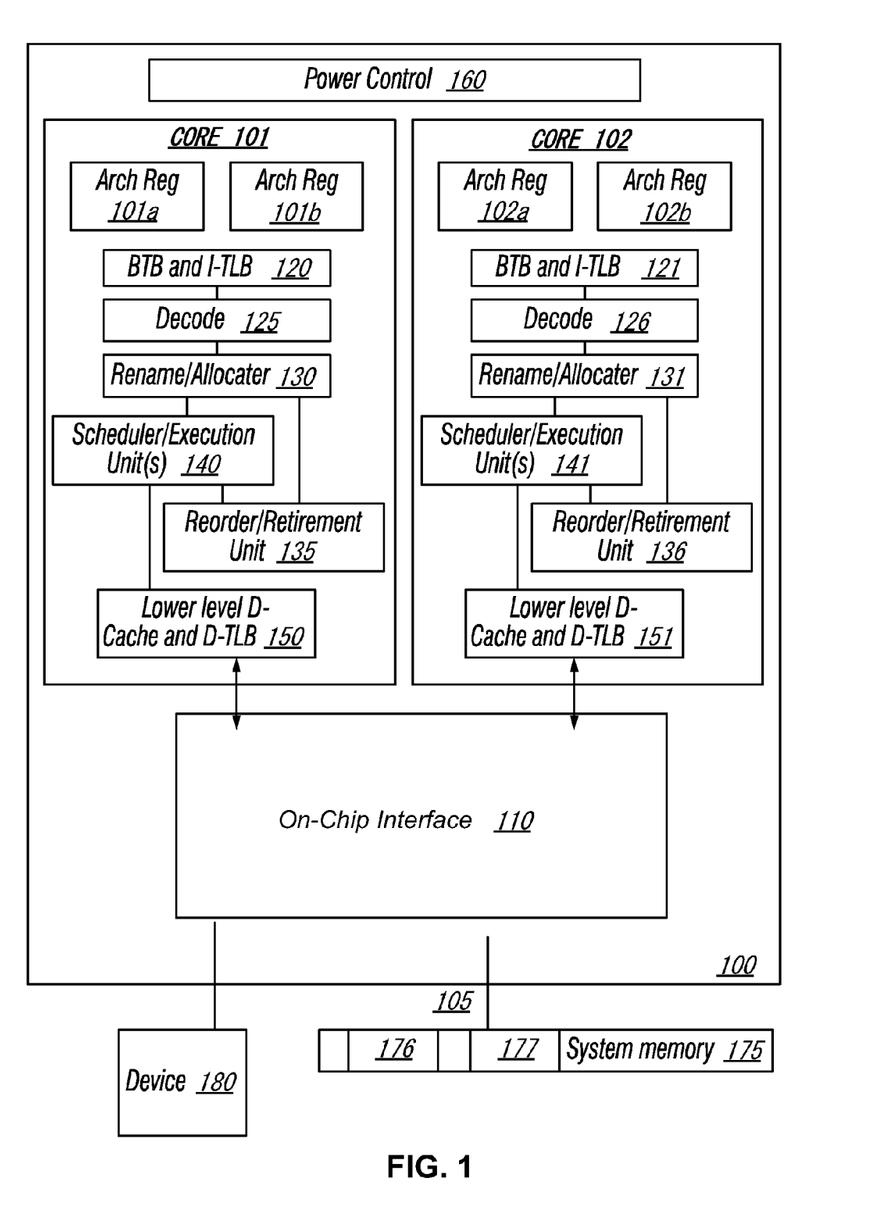
FIG. 1 illustrates a block diagram for an example computing system including a multicore processor in accordance with one embodiment.

Referring to FIG. 1, an embodiment of a block diagram for a computing system including a multicore processor is depicted. Processor 100 includes any processor or processing device, such as a microprocessor, an embedded processor, a digital signal processor (DSP), a network processor, a handheld processor, an application processor, a co-processor, a system on a chip (SOC), or other device to execute code. Processor 100, in one embodiment, includes at least two cores—core 101 and 102, which may include asymmetric cores or symmetric cores (the illustrated embodiment). However, processor 100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 100, as illustrated in FIG. 1, includes two cores—core 101 and 102. Here, core 101 and 102 are considered symmetric cores, i.e. cores with the same configurations, functional units, and/or logic. In another embodiment, core 101 includes an out-of-order processor core, while core 102 includes an in-order processor core. However, cores 101 and 102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 101 are described in further detail below, as the units in core 102 operate in a similar manner in the depicted embodiment.

As depicted, core 101 includes two hardware threads 101a and 101b, which may also be referred to as hardware thread slots 101a and 101b. Therefore, software entities, such as an operating system, in one embodiment potentially view processor 100 as four separate processors, i.e., four logical processors or processing elements capable of executing four software threads concurrently. As alluded to above, a first thread is associated with architecture state registers 101a, a second thread is associated with architecture state registers 101b, a third thread may be associated with architecture state registers 102a, and a fourth thread may be associated with architecture state registers 102b. Here, each of the architecture state registers (101a, 101b, 102a, and 102b) may be referred to as processing elements, thread slots, or thread units, as described above. As illustrated, architecture state registers 101a are replicated in architecture state registers 101b, so individual architecture states/contexts are capable of being stored for logical processor 101a and logical processor 101b. In core 101, other smaller resources, such as instruction pointers and renaming logic in allocator and renamer block 130 may also be replicated for threads 101a and 101b. Some resources, such as re-order buffers in reorder/retirement unit 135, ILTB 120, load/store buffers, and queues may be shared through partitioning. Other resources, such as general purpose internal registers, page-table base register(s), low-level data-cache and data-TLB 115, execution unit(s) 140, and portions of out-of-order unit 135 are potentially fully shared.

Processor 100 often includes other resources, which may be fully shared, shared through partitioning, or dedicated by/to processing elements. In FIG. 1, an embodiment of a purely exemplary processor with illustrative logical units/resources of a processor is illustrated. Note that a processor may include, or omit, any of these functional units, as well as include any other known functional units, logic, or firmware not depicted. As illustrated, core 101 includes a simplified, representative out-of-order (OOO) processor core. But an in-order processor may be utilized in different embodiments. The OOO core includes a branch target buffer 120 to predict branches to be executed/taken and an instruction-translation buffer (I-TLB) 120 to store address translation entries for instructions.

Core 101 further includes decode module 125 coupled to fetch unit 120 to decode fetched elements. Fetch logic, in one embodiment, includes individual sequencers associated with thread slots 101a, 101b, respectively. Usually core 101 is associated with a first ISA, which defines/specifies instructions executable on processor 100. Often machine code instructions that are part of the first ISA include a portion of the instruction (referred to as an opcode), which references/specifies an instruction or operation to be performed. Decode logic 125 includes circuitry that recognizes these instructions from their opcodes and passes the decoded instructions on in the pipeline for processing as defined by the first ISA. For example, as discussed in more detail below decoders 125, in one embodiment, include logic designed or adapted to recognize specific instructions, such as transactional instruction. As a result of the recognition by decoders 125, the architecture or core 101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 126, in one embodiment, recognize the same ISA (or a subset thereof). Alternatively, in a heterogeneous core environment, decoders 126 recognize a second ISA (either a subset of the first ISA or a distinct ISA).

In one example, allocator and renamer block 130 includes an allocator to reserve resources, such as register files to store instruction processing results. However, threads 101a and 101b are potentially capable of out-of-order execution, where allocator and renamer block 130 also reserves other resources, such as reorder buffers to track instruction results. Unit 130 may also include a register renamer to rename program/instruction reference registers to other registers internal to processor 100. Reorder/retirement unit 135 includes components, such as the reorder buffers mentioned above, load buffers, and store buffers, to support out-of-order execution and later in-order retirement of instructions executed out-of-order.

Scheduler and execution unit(s) block 140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 150 are coupled to execution unit(s) 140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 101 and 102 share access to higher-level or further-out cache, such as a second level cache associated with on-chip interface 110. Note that higher-level or further-out refers to cache levels increasing or getting further way from the execution unit(s). In one embodiment, higher-level cache is a last-level data cache—last cache in the memory hierarchy on processor 100—such as a second or third level data cache. However, higher level cache is not so limited, as it may be associated with or include an instruction cache. A trace cache—a type of instruction cache—instead may be coupled after decoder 125 to store recently decoded traces. Here, an instruction potentially refers to a macro-instruction (i.e. a general instruction recognized by the decoders), which may decode into a number of micro-instructions (micro-operations).

In the depicted configuration, processor 100 also includes on-chip interface module 110. Historically, a memory controller, which is described in more detail below, has been included in a computing system external to processor 100. In this scenario, on-chip interface 11 is to communicate with devices external to processor 100, such as system memory 175, a chipset (often including a memory controller hub to connect to memory 175 and an I/O controller hub to connect peripheral devices), a memory controller hub, a northbridge, or other integrated circuit. And in this scenario, bus 105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 175 may be dedicated to processor 100 or shared with other devices in a system. Common examples of types of memory 175 include DRAM, SRAM, non-volatile memory (NV memory), and other known storage devices. Note that device 180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 100. For example in one embodiment, a memory controller hub is on the same package and/or die with processor 100. Here, a portion of the core (an on-core portion) 110 includes one or more controller(s) for interfacing with other devices such as memory 175 or a graphics device 180. The configuration including an interconnect and controllers for interfacing with such devices is often referred to as an on-core (or un-core configuration). As an example, on-chip interface 110 includes a ring interconnect for on-chip communication and a high-speed serial point-to-point link 105 for off-chip communication. Yet, in the SOC environment, even more devices, such as the network interface, co-processors, memory 175, graphics processor 180, and any other known computer devices/interface may be integrated on a single die or integrated circuit to provide small form factor with high functionality and low power consumption.

In one embodiment, processor 100 is capable of executing a compiler, optimization, and/or translator code 177 to compile, translate, and/or optimize application code 176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 2:
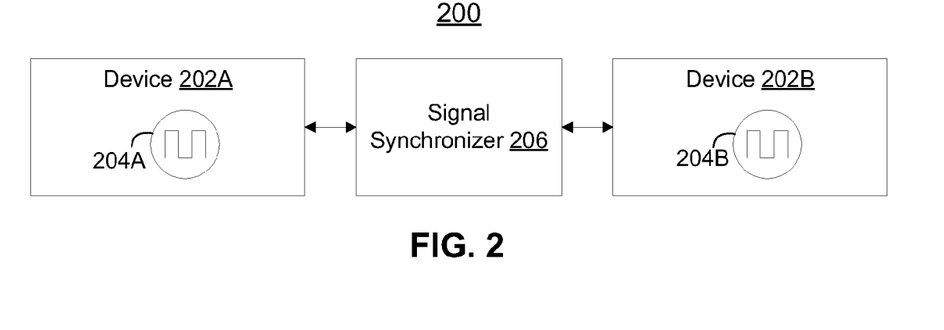
FIG. 2 illustrates an example system for performing edge-aware synchronization of a data signal in accordance with one embodiment.

FIG. 2 illustrates an example system 200 for performing edge-aware synchronization of a data signal in accordance with one embodiment. System 200 includes device 202A in communication with another device 202B. Device 202A (or a portion thereof) may operate at a frequency of clock 204A and device 202B (or a portion thereof) may operate at a frequency of clock 204B. Thus, device 202A may comprise a first clock domain operating at a first frequency and device 202B may comprise a second clock domain that may operate at a frequency that is different from the first frequency. Successful communication between the first clock domain and the second clock domain may involve synchronizing signals that are asynchronous with the clock domain into which the signals are entering. For example, a signal passing into device 202A may be synchronized to clock 204A, while a signal passing into device 202B may be synchronized to clock 204B. Synchronizing incoming signals allows metastability to resolve before the receiving clock domain uses the signal.

One method for synchronizing incoming signals includes flopping unsynchronized signals twice. This method involves two flip-flops connected in series with both flip-flops clocked by the clock with which synchronization is desired. The signal to be synchronized is the input of the first flip-flop, the output of the first flip-flop is the input to the second flip-flop, and the output of the second flip-flop is the synchronized signal. Since the clock and input signal have an unknown timing relationship, the output of the first flop may be metastable. The synchronizer provides one clock cycle for any potential metastable events to resolve. Then the second flop produces the metastability-free output synchronized signal. Two-flop synchronizers synchronize both edges of the incoming signal, but add one to two cycles of latency to the signal during both rising and falling transitions. As used herein, an edge of a signal may refer to a single edge of a signal (e.g., a rising or falling edge) or a series of edges having similar transitions (e.g., all rising edges of the signal or all falling edges of the signal).

Certain signals only require synchronization of one edge. Edge-aware synchronization involves synchronizing only one desired edge of a signal. Signal synchronizer 206 is an edge-aware synchronizer operable to synchronize one edge of one or more signals. Signal synchronizer 206 introduces reduced latency relative to a two flop-synchronizer when producing a synchronized signal. Signal synchronizer 206 may perform edge-aware synchronization on any number of signals to be transmitted to device 202A or device 202B.

As will be described in further detail below, signal synchronizer 206 may synchronize signals from a clock crossing data storage element, such as a data FIFO that holds data to be transferred from one clock domain to another. Of course, any suitable storage element may be used, such as a collection of latches, flip-flops, or other element suitable to hold data. In some embodiments, signal synchronizer 206 performs edge-aware synchronization on control signals such as signals indicating that the data FIFO is full (a "FIFO Full" signal) or empty (a "FIFO Empty" signal). In such embodiments, only a falling edge of the FIFO Full signal needs to be synchronized with the clock of the transmitting device (since the rising edge of the FIFO Full signal occurs on an operation performed by the transmitting device and thus is already synchronized to the transmitting device). Similarly, only a falling edge of the FIFO Empty signal needs to be synchronized with the clock of the receiving device (since the rising edge of the FIFO Empty signal occurs on an operation performed by the receiving device and thus is already synchronized to the receiving device). Such an embodiment will be explored in more detail below in connection with FIGS. 6-8.

Figure 4:
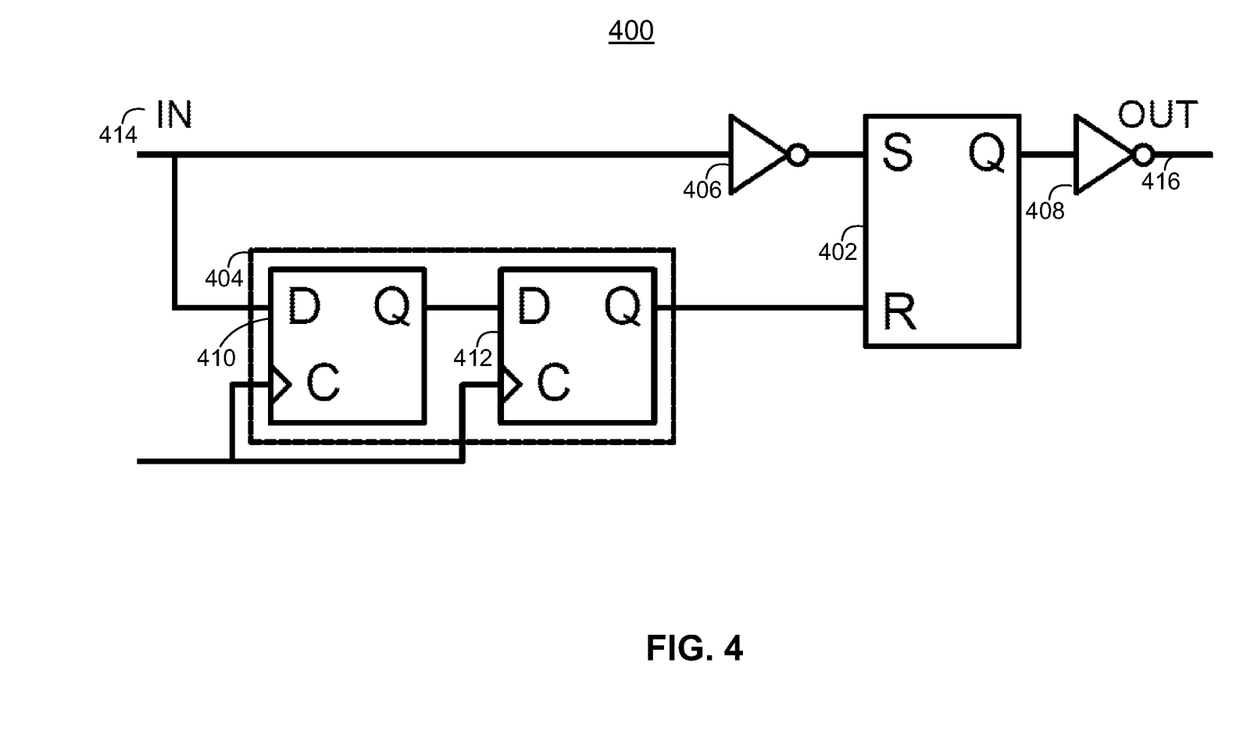
FIG. 4 illustrates an example circuit for synchronizing a rising edge of a data signal in accordance with one embodiment.
Figure 5:
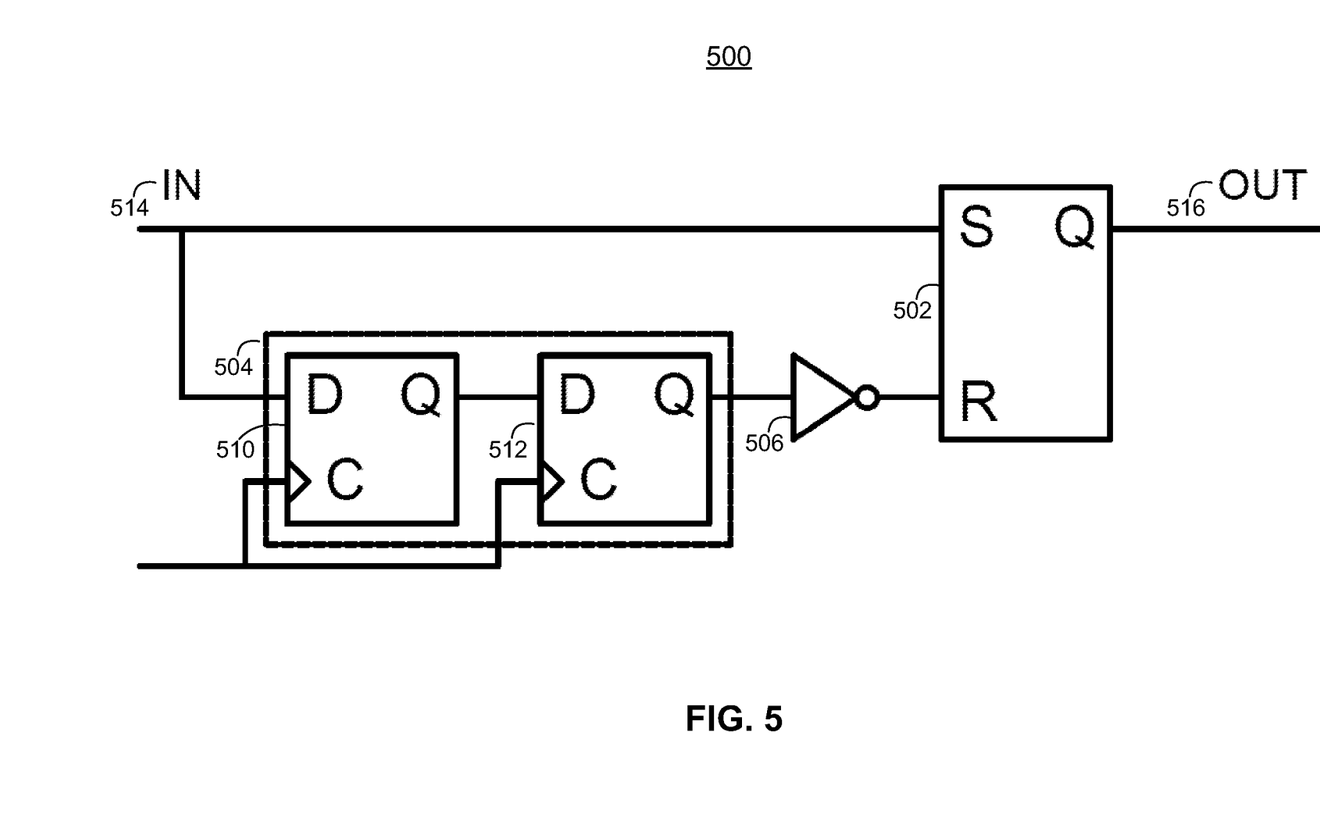
FIG. 5 illustrates an example circuit for synchronizing a falling edge of a data signal in accordance with one embodiment.

In particular embodiments, signal synchronizer 206 includes a rising edge synchronizer (such as rising edge synchronizer 400 described below) operable to synchronize only the rising edge of a signal that is input to the rising edge synchronizer and/or a falling edge synchronizer (such as falling edge synchronizer 500 described below) operable to synchronize only the falling edge of a signal that is input to the falling edge synchronizer.

Signal synchronizer 206 may be used with any suitable device 202, such as a desktop computer system, server computer system, handheld device (such as a cellular phone, Internet protocol device, digital camera, PDA, or handheld PC), tablet, notebook computer system, SOC device, embedded application, network communication device, or other device suitable to transmit or receive data. In some embodiments, signal synchronizer 206 is used to perform edge-aware synchronization between components of a device, such as cores 101 and 102 (or other processing elements) of processor 100 or cores 906 and 907 (or other processing elements) of system on-chip (SOC) 900 described below with respect to FIG. 9. Thus, any suitable communication elements may be represented by devices 202 of FIG. 2. In general, the embodiments of the signal synchronizer 206 described herein may be used in any system where synchronization of a single edge of a signal is sufficient.

Figure 3:
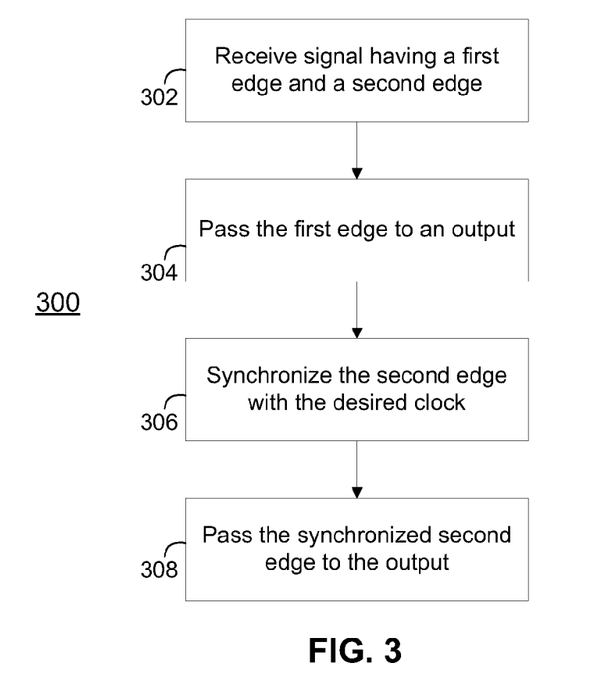
FIG. 3 illustrates an example method for performing edge-aware synchronization of a data signal in accordance with one embodiment.

FIG. 3 illustrates an example method 300 for performing edge-aware synchronization of a data signal in accordance with one embodiment. At step 302, a signal having a first edge and a second edge is received, for example, by signal synchronizer 206. In this example, the second edge of the incoming signal is not synchronized with the desired clock, while the first edge of the signal may or may not already be synchronized with the desired clock.

At step 304, the first edge of the signal is passed to the output of the signal synchronizer 206. While the first edge of the signal may pass through one or more buffers such as inverters or the like, no synchronization is performed on the first edge of the signal. As mentioned earlier, this is because an edge-aware synchronizer only synchronizes one edge of a signal. At step 306, the second edge of the signal is synchronized with the desired clock. The second edge of the signal may be synchronized using the two flop method described above or any other suitable synchronization method. The synchronized second edge is then passed to the output at step 308. Before being passed to the output, the synchronized second edge may pass through one or more buffers such as an inverters or the like.

Some of the steps illustrated in FIG. 3 may be combined, modified or deleted where appropriate, and additional steps may also be added to the flowchart. Additionally, steps may be performed in any suitable order without departing from the scope of particular embodiments.

FIG. 4 illustrates an example circuit 400 for synchronizing a rising edge of a data signal 414 in accordance with one embodiment. Rising edge synchronizer 400 comprises an SR latch 402, a synchronization circuit 404 comprising flip-flops 410 and 412 connected in series, and inverters 406 and 408. Any suitable synchronization circuit may be used in place of synchronization circuit 404. For example, the synchronization circuit can comprise one or more flip-flops or other synchronization circuit. Flip-flops 410 and 412 are clocked by the clock to which synchronization of the rising edge is desired. An input signal 414 passes through inverter 406 to the S input of SR latch 402 and also passes to the input of the first flop 410, through the second flop 512, and to the R input of SR latch 402. The output of SR latch 402 passes through inverter 408 to the output 416 of the rising edge synchronizer 400.

The rising edge synchronizer 400 performs only the necessary synchronizations (i.e., synchronization of the rising edges) and eliminates the delay penalty during falling transitions. On a falling transition in the input signal 414, the falling transition directly sets SR latch 402 after it is inverted through inverter 406. The set input overrides the reset input and propagates to the output 16 through inverter 408 without synchronization latency. On the rising edge of the input signal 414, the transition propagates through synchronization circuit 404 before resetting the SR latch, performing synchronization of the rising edge to the desired clock. In this manner, rising edge synchronizer 400 synchronizes the rising edges of the input signal 414 to the desired clock while allowing the falling edges of the input signal 414 to pass through without performing synchronization operations on the falling edges.

FIG. 5 illustrates an example circuit 500 for synchronizing a falling edge of a data signal in accordance with one embodiment. Falling edge synchronizer 500 comprises an SR latch 502, a synchronization circuit 504 comprising flip-flops 510 and 512 connected in series, and an inverter 506. Any suitable synchronization circuit may be used in place of synchronization circuit 504. For example, the synchronization circuit can comprise one or more flip-flops or other synchronization circuit. Flip-flops 510 and 512 are clocked by the clock to which synchronization of the falling edge is desired. An input signal 514 passes to the S input of SR latch 502 and also passes to the input of the first flop 510, through the second flop 512 and inverter 506, and to the R input of SR latch 502. The output of SR latch 502 passes to the output 516 of the falling edge synchronizer 500.

The falling edge synchronizer 500 performs only the necessary synchronizations (i.e., synchronization of the falling edges) to eliminate delay penalty during rising transitions. On a rising transition in the input signal 514, the rising transition directly sets SR latch 502. The set input overrides the reset input and propagates to the output 516 without synchronization latency. On the falling edge of the input signal, the transition propagates through synchronization circuit 504 and inverter 506 before resetting the SR latch, performing synchronization of the falling edge to the desired clock. In this manner, falling edge synchronizer 500 synchronizes the falling edges of the input signal 514 to the desired clock while allowing the rising edges of the input signal 514 to pass through without performing synchronization operations on the rising edges.

In particular embodiments, a signal synchronizer, such as signal synchronizer 206, may include one or both of rising edge synchronizer 400 and falling edge synchronizer 500. As mentioned earlier, signal synchronizer 206 may be used to facilitate communication between cores or other processing elements of a processor. In some embodiments, one or more signal synchronizers 206 are used in a network on a chip (NoC). An NoC is a fabric topology that may be used in multi-core systems. An NoC may be located on a die which includes a plurality of cores or other processing elements, which may be asymmetric or symmetric. Each of the plurality of cores and processing elements may have a router that can communicatively couple the core or processing element with other cores or processing elements. The routers may be communicatively linked with one another in a network. In one embodiment, the plurality of routers are arranged in a grid network. NoCs send data from a source to a destination through a shared interconnect constituted of these routers connected with links. Synchronous packet-switched NoCs may be built from routers that communicate with their neighbors based on a global clock. Packet switching refers to flopping/storing data at least in each router. Thus all the routers in a synchronous packet-switched NoC operate at the same frequency.

Source-synchronous NoCs send a delay-matched clock along with each data transfer, eliminating the need for a fully-synchronous clock. This technique facilitates multi-clock designs by removing the need for synchronizing first-in first-out data registers (FIFOs) at each router. Furthermore, throughput increases by incurring delay for only exercised paths, instead of the worst-case paths. Process variation is also mitigated by averaging out timing variations, instead of applying worst-case margins as in a fully-synchronous design. Such designs also eliminates margins for clock skew and jitter. However, source-synchronous NoCs that use packet switching consume clock power to flop the data and control signals at least once at each router. Source-synchronous operation and packet switching are independent of each other.

In various embodiments, a hybrid NoC is provided having a source-synchronous design. In a hybrid NoC, a packet-switched reservation packet is used to establish a circuit-switched data channel. In an embodiment, the packet-switched reservation packet may be relatively small and the circuit-switched data transfer relatively large. Packets are flopped at least once at each router node. In contrast, circuit-switched transfers have no intra-route storage, reducing clock power. In this way the NoC enables hybrid packet and circuit-switched data communication to occur with increased energy efficiency and throughput over fully synchronous or packet-switched NoCs. By transmitting the majority of data on a circuit-switched channel, intervening storage elements can be avoided, reducing power consumption. And by using the hybrid design, a packet-switched network can be used to reserve a path of the circuit-switched network, mitigating congestion from contention for network resources.

Hybrid NoCs thus combine the throughput of packet-switched networks with the energy efficiency of circuit-switched data channels. Using a source synchronous arrangement, a processor such as a system on a chip (SoC) including the NoC may be designed with multiple clock domains. Source synchronous operation facilitates integration of heterogeneous NoCs with numerous clock domains without global clock distribution or synchronizing data FIFO buffers in each router. As such, network performance is prevented from being globally limited by slow paths or routers and throughput increases by averaging process variation-induced timing variations and eliminating margining for clock skew and jitter.

Figure 6:
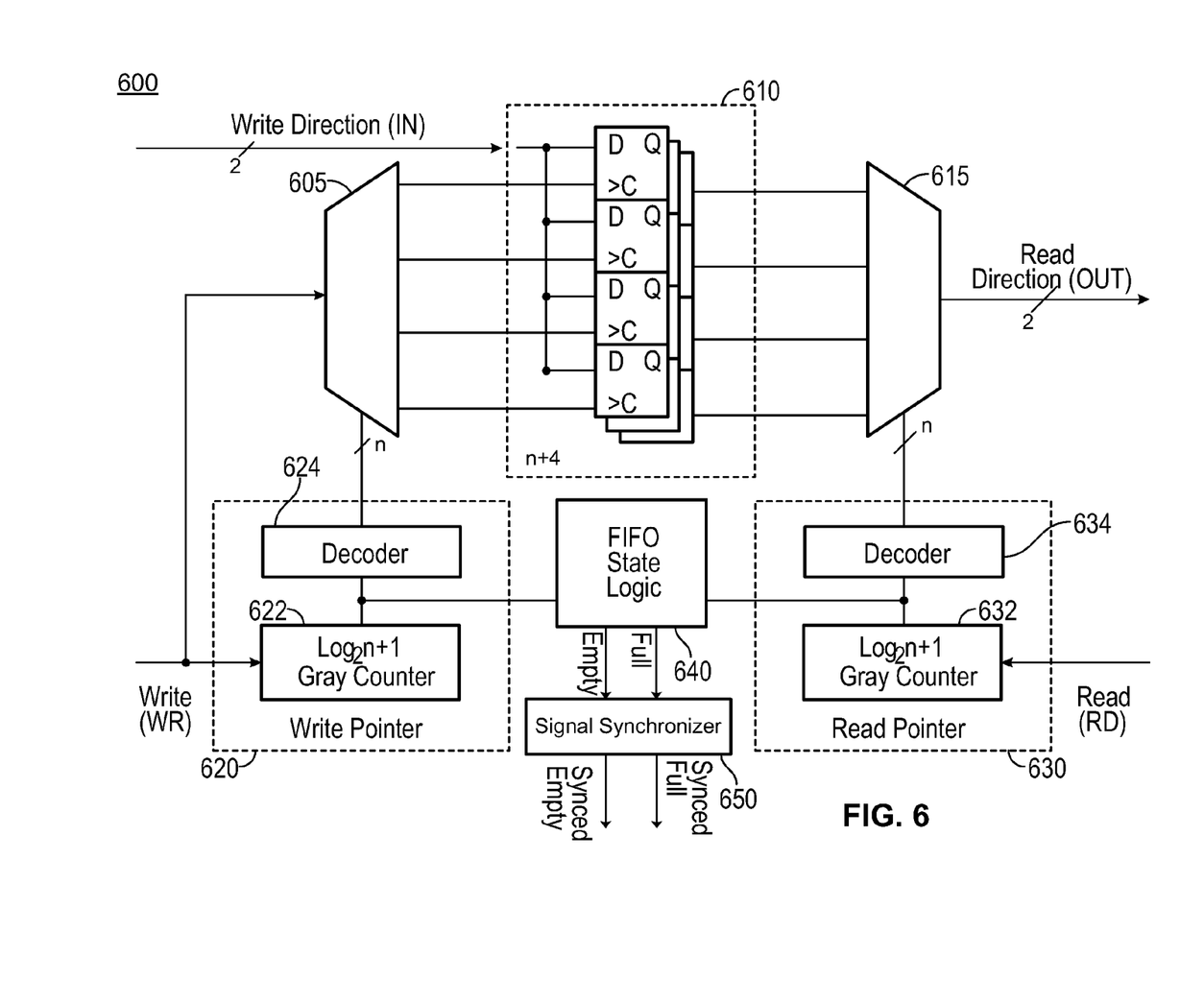
FIG. 6 illustrates an example clock crossing FIFO with a signal synchronizer in accordance with one embodiment.

In particular embodiments, an NoC (such as a hybrid packet/circuit-switched NoC) uses one or more clock-crossing data FIFOs having control signals (such as FIFO Full and Empty signals) synchronized across clock boundaries. FIG. 6 illustrates an example clock crossing data FIFO 600 with a signal synchronizer 650 in accordance with one embodiment.

In the embodiment depicted, FIFO 600 is implemented with a 4-deep register and rotating write and read pointers 620 and 630. A FIFO bank 610 receives incoming write data into a corresponding one of its entries via a demultiplexer 605 controlled by a write pointer 620 that in turn includes a Gray counter 622 and a decoder 624. The entries of FIFO bank 610 are coupled to an output multiplexer 615, which outputs a selected entry to be read via a read pointer 630 controlled by a Gray counter 632 and a decoder 634.

FIFO 600 may be configured as the interface between packet-switched reservations and circuit-switched transfers. The pointers are implemented as Gray counters to allow glitch-free asynchronous write and read operations. Since reservations for circuit transfers may be queued, the reservation packets propagate faster than the circuit-switched transfers and set up the downstream circuit-switched channels ahead of time to hide address decoding and direction arbitration latencies.

In the embodiment shown, the FIFO pointers are Gray encoded to prevent glitching, and the FIFO operates as a circular FIFO. This encoding also enables a comparison between read and write pointers without any glitches to determine if the FIFO is full or empty. FIFO state logic 640 may comprise any suitable logic to determine whether the register of FIFO 600 is full or empty. As an example, FIFO state logic 640 may comprise logic gates that compare the output of Gray counter 622 and Gray counter 632 and set a FIFO Empty signal if the counters have equivalent values and set a FIFO Full signal if the comparison indicates a difference between the counters that is equal to the number of entries in the FIFO. One possible implementation of such logic includes a set of XOR gates that are each coupled to the same significance bit of each Gray counter. The outputs of these XOR gates may be coupled to a NOR gate that outputs the FIFO Empty signal. Based on such logic, the FIFO empty signal will be low whenever the Gray counters have different values. The outputs of the XOR gates may further be coupled to another NOR gate having one inverted input corresponding to the most significant bit of the Gray counters. The output of this NOR gate is the FIFO Full signal. This output will be low unless the highest significant bit of each Gray counter is different while the other bits match.

The FIFO Full signal only needs to be synchronized to the clock of the write domain (the "write clock"). When writing into the FIFO, the FIFO Full signal is checked to ensure that the FIFO is not written to when it is full. The rising edge of this signal only occurs during a write operation, which is synchronous to the write clock, and does not need to be synchronized. The falling edge of the FIFO Full signal occurs during a FIFO read, which is generally a completely unsynchronized event to the write clock (but rather is synchronized with the read clock). The falling edge of the FIFO Full signal needs to be synchronized with the write clock using the two-flop or other method.

The FIFO Empty signal only needs to be synchronized to the clock of the read domain (the "read clock"). When reading from the FIFO, the FIFO Empty signal is checked to ensure that the FIFO is not read from when it is empty. The rising edge of this signal only occurs during a read operation, which is synchronous to the read clock, and does not need to be synchronized. The falling edge of the FIFO Empty signal occurs during a FIFO write, which is generally a completely unsynchronized event to the read clock (but rather is synchronized with the write clock). The falling edge of the FIFO Empty signal needs to be synchronized with the read clock using the two-flop or other method.

In the embodiment depicted, the FIFO Empty signal and the FIFO Full signal are coupled to signal synchronizer 650. Signal synchronizer 650 performs edge-aware synchronization of these signals to produce a FIFO Empty signal having a falling edge that is synchronized with the read clock and a FIFO Full signal having a falling edge that is synchronized with the write clock. Signal synchronizer 650 may have any of the attributes of signal synchronizer 206 described herein. In a particular embodiment, signal synchronizer 650 comprises two instances of falling edge synchronizer 500. One instance may have its input coupled to the FIFO Empty signal, its synchronizer circuit 504 clocked by the read clock, and its output coupled to the read domain. Another instance may have its input coupled to the FIFO Full signal, its synchronizer circuit 504 clocked by the write clock, and its output coupled to the write domain. In such an implementation, signal synchronizer 650 will synchronize the falling edge of the FIFO Empty signal with the read clock while allowing the rising edge of the FIFO Empty signal to pass without performing synchronization operations on the rising edge. Similarly, signal synchronizer 650 will synchronize the falling edge of the FIFO Full signal with the write clock while allowing the rising edge of the FIFO Full signal to pass without performing synchronization operations on the rising edge. Of course, if active-low logic is used wherein low signals signify a full FIFO and an empty FIFO, signal synchronizer 650 may instead include two instances of rising edge synchronizer 400.

In general, edge-aware synchronization halves latency penalties. In clock crossing FIFOs, edge-aware synchronization has the added benefit of incurring latency penalties only when they will have a small impact on throughput. For example, during a write, the FIFO Full signal is checked. This signal experiences a latency penalty only on the high-to-low transition when a read occurs. However, any latency added during this step occurs when the FIFO is nearly full. Thus read operations will not be delayed, and the delayed write will have a small impact on the throughput of the system. Similarly in the read case, latency to the FIFO Empty signal is only introduced when the FIFO is nearly empty, promoting high throughput.

Figure 7:
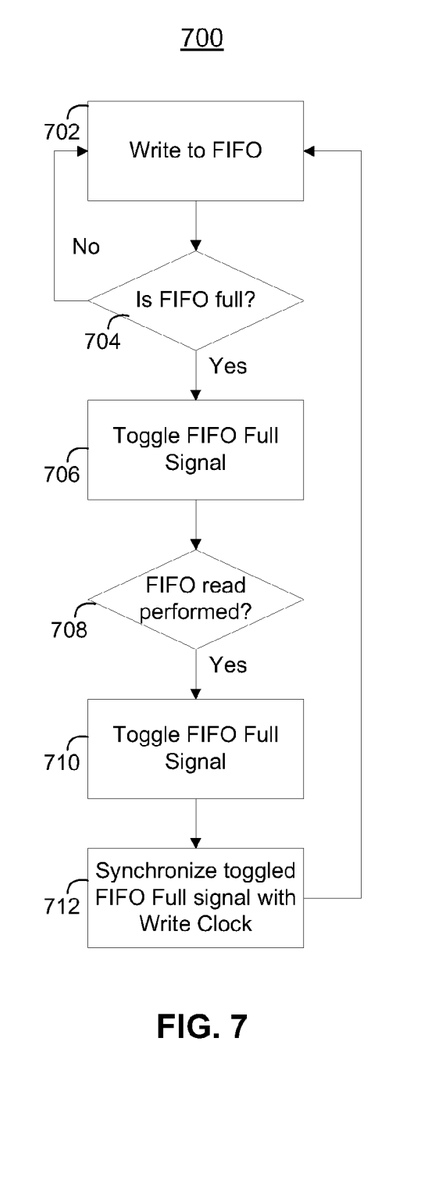
FIG. 7 illustrates an example method for performing edge-aware synchronization of a FIFO Full signal in accordance with one embodiment.

FIG. 7 illustrates an example method 700 for performing edge-aware synchronization of a FIFO Full signal in accordance with one embodiment. At step 702, the FIFO is written to. For example, a circuit in the write domain may write a data value into a register of the FIFO. At step 704, logic checks to see whether the FIFO is full. If the FIFO is not full, one or more additional writes may be performed to the FIFO at step 702. If it is determined at step 704 that the FIFO is full, the FIFO full signal is toggled at step 706. In one embodiment, the FIFO full signal will transition from low to high when the FIFO becomes full. However, no synchronization of this signal edge is performed.

At step 708, it is determined whether the FIFO has been read from. This step may be performed periodically or may be triggered by receipt of a signal, such as a signal generated when a read is performed by the read domain. Upon a determination that a read has occurred, the FIFO full signal is toggled at step 710. For example, the FIFO full signal may transition from a high to a low value. In response to this transition, the toggled edge is synchronized with the write clock. One or more additional writes may then be performed at step 702

Some of the steps illustrated in FIG. 7 may be combined, modified or deleted where appropriate, and additional steps may also be added to the flowchart. Additionally, steps may be performed in any suitable order without departing from the scope of particular embodiments.

Figure 8:
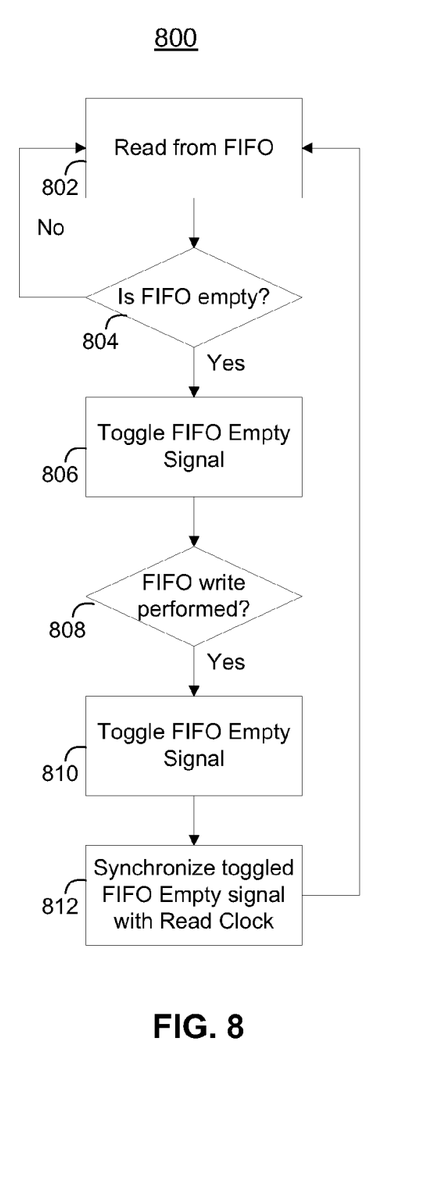
FIG. 8 illustrates an example method for performing edge-aware synchronization of a FIFO Empty signal in accordance with one embodiment.

FIG. 8 illustrates an example method for performing edge-aware synchronization of a FIFO Empty signal in accordance with one embodiment. At step 802, the FIFO is read from. For example, a circuit in the read domain may read a data value from a register of the FIFO. At step 804, logic checks to see whether the FIFO is empty. If the FIFO is not empty, one or more additional reads may be performed to the FIFO at step 802. If it is determined at step 804 that the FIFO is empty, the FIFO empty signal is toggled at step 806. In one embodiment, the FIFO empty signal will transition from low to high when the FIFO becomes empty. However, no synchronization of this signal edge is performed.

At step 808, it is determined whether the FIFO has been written to. This step may be performed periodically or may be triggered by receipt of a signal, such as a signal generated when a write is performed by the write domain. Upon a determination that a write has occurred, the FIFO empty signal is toggled at step 810. For example, the FIFO empty signal may transition from a high to a low value. In response to this transition, the toggled edge is synchronized with the read clock. One or more additional reads may then be performed at step 802.

Some of the steps illustrated in FIG. 8 may be combined, modified or deleted where appropriate, and additional steps may also be added to the flowchart. Additionally, steps may be performed in any suitable order without departing from the scope of particular embodiments.

Figure 9:
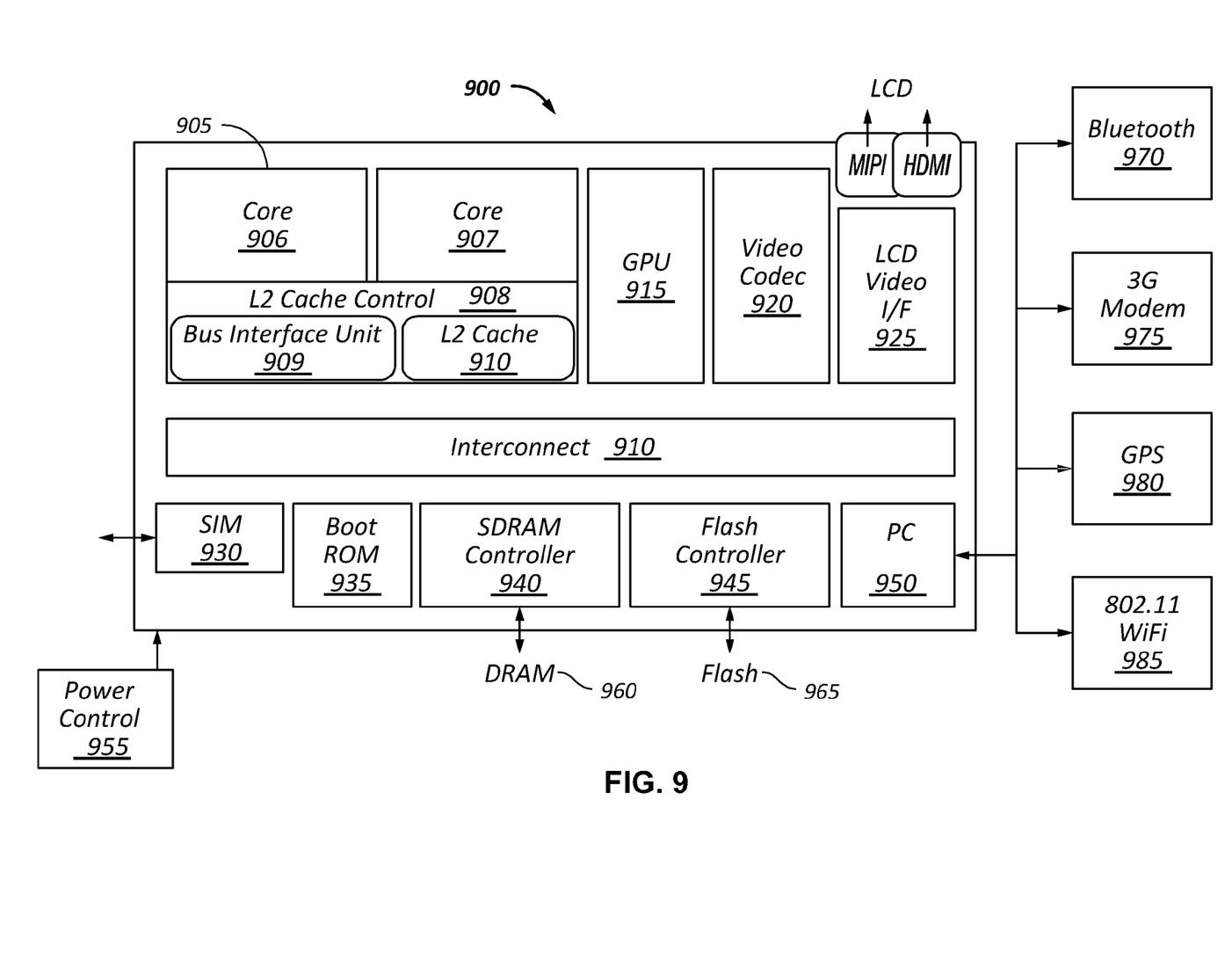
FIG. 9 illustrates another embodiment of a block diagram for an example computing system in accordance with one embodiment.

FIG. 9 illustrates another embodiment of a block diagram for an example computing system in accordance with one embodiment. In this figure, an embodiment of a system on-chip (SOC) design in accordance with the disclosures is depicted. As a specific illustrative example, SOC 900 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 900 includes 2 cores-906 and 907. Similar to the discussion above, cores 906 and 907 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 906 and 907 are coupled to cache control 908 that is associated with bus interface unit 909 and L2 cache 910 to communicate with other parts of system 900. Interconnect 910 includes an on-chip interconnect, such as an IOSF, AMBA, or other interconnect discussed above, which potentially implements one or more aspects of the described disclosure.

Interface 910 provides communication channels to the other components, such as a Subscriber Identity Module (SIM) 930 to interface with a SIM card, a boot rom 935 to hold boot code for execution by cores 906 and 907 to initialize and boot SOC 900, a SDRAM controller 940 to interface with external memory (e.g. DRAM 960), a flash controller 945 to interface with non-volatile memory (e.g. Flash 965), a peripheral control Q1650 (e.g. Serial Peripheral Interface) to interface with peripherals, video codecs 920 and Video interface 925 to display and receive input (e.g. touch enabled input), GPU 915 to perform graphics related computations, etc. Any of these interfaces may incorporate aspects of the disclosure described herein.

In addition, the system illustrates peripherals for communication, such as a Bluetooth module 970, 3G modem 975, GPS 985, and WiFi 985. Note as stated above, a UE includes a radio for communication. As a result, these peripheral communication modules are not all required. However, in a UE some form a radio for external communication is to be included.

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc, which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

One or more embodiments may provide an apparatus, a system, a machine readable storage, a machine readable medium, hardware- and/or software-based logic (e.g., a signal synchronizer), and a method to receive a signal to comprise a first edge and a second edge, synchronize the first edge of the signal with a first clock and pass the synchronized first edge of the signal to an output, wherein the synchronization is to result in a delay of the first edge of the signal, and pass the second edge of the signal to the output with a delay that is less than the delay of the first edge of the signal by at least one clock cycle of the first clock.

In at least one example, the first edge of the signal is to occur in synchronization with a second clock.

In at least one example, the first edge of the signal is to comprise a rising edge and the second edge of the signal is to comprise a falling edge.

In at least one example, the first edge of the signal is to comprise a falling edge and the second edge of the signal is to comprise a rising edge.

In at least one example, the signal synchronizer is to comprise a set-reset (SR) latch.

In at least one example, the SR latch is to receive an inverted version of the signal at a set (S) input and a version of the signal that is synchronized to the first clock at a reset (R) input, wherein the S input is to override the R input.

In at least one example, the signal synchronizer is to comprise two flip-flops to synchronize the signal to the first clock and provide the synchronized signal to the R input of the SR latch.

In at least one example, the signal synchronizer is to further comprise an inverter to invert an output of the SR latch prior to passing the signal to the output.

In at least one example, the SR latch is to receive the signal at an S input and an inverted version of the signal that is synchronized to the first clock at an R input, wherein the S input is to override the R input.

In at least one example, the signal synchronizer is to comprise two flip-flops to synchronize the signal to the first clock and provide the synchronized signal to an inverter that generates the inverted version of the signal.

One or more embodiments may provide an apparatus, a system, a machine readable storage, a machine readable medium, hardware- and/or software-based logic, and a method wherein a storage element is to hold one or more data entries, first logic is to generate a first signal indicating that the storage element is full, second logic is to generate a second signal indicating that the storage element is empty, a first signal synchronizer to synchronize a first edge of the first signal with a first clock without synchronizing a second edge of the first signal with the first clock; and a second signal synchronizer is to synchronize a first edge of the second signal with a second clock without synchronizing a second edge of the second signal with the second clock.

In at least one example, commands to write to the storage element are to be performed in synchronization with the first clock and commands to read from the storage element are to be performed in synchronization with the second clock.

In at least one example, the storage element is to hold data to be passed from a first clock domain associated with the first clock to a second clock domain associated with the second clock.

In at least one example, the first edge of the first signal is to comprise a falling edge and the second edge of the first signal is to comprise a rising edge.

In at least one example, the first edge of the second signal is to comprise a falling edge and the second edge of the second signal is to comprise a rising edge.

In at least one example, the first signal synchronizer is to comprise an SR latch having an S input coupled to an input of the signal synchronizer, wherein the SR latch comprises an R input coupled to an output of an inverter, wherein the S input is to override the R input, and a pair of serially connected flip-flops, wherein the first flip-flop comprises an input coupled to the input of the of the signal synchronizer, wherein the second flip-flop comprises an output coupled to an input of the inverter.

In at least one example, the apparatus further comprises a router of a network on a chip, wherein the router is to communicate with the first signal synchronizer.

One or more embodiments may provide a non-transitory machine readable medium including information to represent structures, when manufactured, to be configured to receive a signal comprising a first edge and a second edge, synchronize the first edge of the signal with a first clock and pass the synchronized first edge of the signal to an output, wherein the synchronization is to result in a delay of the first edge of the signal, and pass the second edge of the signal to the output, the passed second edge of the signal having a delay that is less than the delay of the first edge of the signal by at least one clock cycle of the first clock.

One or more embodiments may provide an apparatus, a system, a machine readable storage, a machine readable medium, hardware- and/or software-based logic, and a method wherein a first device operates at a frequency of a first clock, a second device is coupled to the first device by one or more links, the second device operates at a frequency of a second clock, the second device to receive data from the first device, and a signal synchronizer is to synchronize a first edge of a first signal with the second clock, wherein the synchronization is to result in a delay of the first edge of the first signal, and pass a second edge of the first signal, the passed second edge of the first signal having a delay that is less than the delay of the first edge of the first signal by at least one clock cycle of the second clock.

In at least one example, the signal synchronizer is further to synchronize a first edge of a second signal with the first clock, wherein the synchronization is to result in a delay of the first edge of the second signal, and pass a second edge of the second signal, the passed second edge of the second signal having a delay that is less than the delay of the first edge of the second signal by at least one clock cycle of the first clock.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a signal synchronizer to:
receive a signal, wherein the signal is to comprise a first edge and a second edge;
synchronize the first edge of the signal with a first clock and pass the synchronized first edge of the signal to an output signal, wherein the synchronization is to result in a delay of the first edge of the signal; and
pass the second edge of the signal to the output signal with a delay that is less than the delay of the first edge of the signal by at least one clock cycle of the first clock.

2. The apparatus of claim 1, wherein the first edge of the signal is to occur in synchronization with a second clock.

3. The apparatus of claim 1, wherein the first edge of the signal is to comprise a rising edge and the second edge of the signal is to comprise a falling edge.

4. The apparatus of claim 1, wherein the first edge of the signal is to comprise a falling edge and the second edge of the signal is to comprise a rising edge.

5. The apparatus of claim 1, wherein the signal synchronizer is to comprise a set-reset (SR) latch.

6. The apparatus of claim 5, wherein the SR latch is to receive an inverted version of the signal at a set (S) input and a version of the signal that is synchronized to the first clock at a reset (R) input, wherein the S input is to override the R input.

7. The apparatus of claim 6, wherein the signal synchronizer is to comprise two flip-flops to synchronize the signal to the first clock and provide the synchronized signal to the R input of the SR latch.

8. The apparatus of claim 6, wherein the signal synchronizer is to further comprise an inverter to invert an output of the SR latch prior to passing the signal to the output signal.

9. The apparatus of claim 5, wherein the SR latch is to receive the signal at an S input and an inverted version of the signal that is synchronized to the first clock at an R input, wherein the S input is to override the R input.

10. The apparatus of claim 9, wherein the signal synchronizer is to comprise two flip-flops to synchronize the signal to the first clock and provide the synchronized signal to an inverter that generates the inverted version of the signal.

11. An apparatus comprising:
a storage element to hold one or more data entries;
first logic to generate a first signal indicating that the storage element is full;
second logic to generate a second signal indicating that the storage element is empty;
a first signal synchronizer to synchronize a first edge of the first signal with a first clock without synchronizing a second edge of the first signal with the first clock; and
a second signal synchronizer to synchronize a first edge of the second signal with a second clock without synchronizing a second edge of the second signal with the second clock.

12. The apparatus of claim 11, wherein commands to write to the storage element are to be performed in synchronization with the first clock and commands to read from the storage element are to be performed in synchronization with the second clock.

13. The apparatus of claim 11, wherein the storage element is to hold data to be passed from a first clock domain associated with the first clock to a second clock domain associated with the second clock.

14. The apparatus of claim 11, wherein the first edge of the first signal is to comprise a falling edge and the second edge of the first signal is to comprise a rising edge.

15. The apparatus of claim 14, wherein the first edge of the second signal is to comprise a falling edge and the second edge of the second signal is to comprise a rising edge.

16. The apparatus of claim 11, wherein the first signal synchronizer is to comprise:
an SR latch having an S input coupled to an input of the signal synchronizer, wherein the SR latch comprises an R input coupled to an output of an inverter, wherein the S input is to override the R input; and
a pair of serially connected flip-flops, wherein the first flip-flop comprises an input coupled to the input of the of the signal synchronizer, wherein the second flip-flop comprises an output coupled to an input of the inverter.

17. The apparatus of claim 11, wherein the apparatus further comprises a router of a network on a chip, wherein the router is to communicate with the first signal synchronizer.

18. A method comprising:
receiving, by a signal synchronizer, a signal comprising a first edge and a second edge;
synchronizing, by the signal synchronizer, the first edge of the signal with a first clock and passing the synchronized first edge of the signal to an output signal, wherein the synchronization is to result in a delay of the first edge of the signal; and
passing, by the signal synchronizer, the second edge of the signal to the output signal, the passed second edge of the signal having a delay that is less than the delay of the first edge of the signal by at least one clock cycle of the first clock.

19. A system comprising:
a first device operating at a frequency of a first clock;
a second device coupled to the first device by one or more links, the second device operating at a frequency of a second clock, the second device to receive data from the first device; and
a signal synchronizer to:
synchronize a first edge of a first signal with the second clock, wherein the synchronization is to result in a delay of the first edge of the first signal, and pass the synchronized first edge of the first signal to an output signal; and
pass a second edge of the first signal to the output signal, the passed second edge of the first signal having a delay that is less than the delay of the first edge of the first signal by at least one clock cycle of the second clock.

20. The system of claim 19, wherein the signal synchronizer is further to:
synchronize a first edge of a second signal with the first clock, wherein the synchronization is to result in a delay of the first edge of the second signal; and
pass a second edge of the second signal, the passed second edge of the second signal having a delay that is less than the delay of the first edge of the second signal by at least one clock cycle of the first clock.

* * * * *

UNITED STATES PATENT AND TRADEMARK OFFICE
CERTIFICATE OF CORRECTION

| | | |
|---|---|---|
| PATENT NO. | : 9,680,459 B2 | Page 1 of 1 |
| APPLICATION NO. | : 14/567987 | |
| DATED | : June 13, 2017 | |
| INVENTOR(S) | : Gregory K. Chen et al. | |

It is certified that error appears in the above-identified patent and that said Letters Patent is hereby corrected as shown below:

In the Drawings

On sheet 1 of 7, in Figure 1, reference numeral 130, Line 1, delete "/Allocater" and insert -- /Allocator --, therefor.

On sheet 1 of 7, in Figure 1, reference numeral 131, Line 1, delete "/Allocater" and insert -- /Allocator --, therefor.

In the Claims

In Column 20, Lines 2-3, in Claim 16, delete "of the of the" and insert -- of the --, therefor.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*